United States Patent
Corke et al.

(10) Patent No.: US 8,306,162 B2
(45) Date of Patent: Nov. 6, 2012

(54) METHOD AND APPARATUS FOR COMPLEMENTARY CUMULATIVE DISTRIBUTION DRIVEN LEVEL CONVERGENCE FOR SPECTRUM SENSING

(75) Inventors: Robert J. Corke, Glen Ellyn, IL (US); Daniel G. Prysby, Sleepy Hollow, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 857 days.

(21) Appl. No.: 11/946,734

(22) Filed: Nov. 28, 2007

(65) Prior Publication Data
US 2009/0135969 A1 May 28, 2009

(51) Int. Cl.
*H04L 27/08* (2006.01)
(52) U.S. Cl. ............ 375/345; 375/346; 455/127.2; 455/127.3; 455/136; 455/232.1; 455/234.1; 455/234.2; 455/239.1; 455/240.1; 455/241.1; 455/245.1; 455/246.1; 455/247.1; 455/250.1; 455/251.1
(58) Field of Classification Search .......... 375/316–317, 375/345; 455/232.1, 233.1, 234.1, 245.1, 455/250.1, 246.1, 247.1, 251.1
See application file for complete search history.

(56) References Cited

U.S. PATENT DOCUMENTS

| | | | |
|---|---|---|---|
| 6,512,472 B1 * | 1/2003 | Smith et al. | 341/155 |
| 6,668,027 B1 | 12/2003 | Scarpa | |
| 6,836,229 B2 | 12/2004 | Gregoire | |
| 6,982,965 B2 * | 1/2006 | Itahara et al. | 370/317 |
| 7,127,223 B2 | 10/2006 | Jin et al. | |
| 7,191,143 B2 * | 3/2007 | Keli et al. | 705/7.32 |
| 7,302,021 B2 * | 11/2007 | Konishi et al. | 375/345 |
| 7,415,083 B2 * | 8/2008 | Anderson | 375/345 |
| 7,519,383 B2 * | 4/2009 | Olgaard | 455/522 |
| 7,577,414 B2 * | 8/2009 | Mehr | 455/234.1 |
| 7,620,119 B2 * | 11/2009 | Narendra et al. | 375/316 |
| 2003/0091132 A1 * | 5/2003 | Anderson | 375/345 |
| 2004/0136395 A1 * | 7/2004 | Itahara et al. | 370/441 |
| 2004/0162043 A1 | 8/2004 | Taubenheim et al. | |
| 2006/0222118 A1 | 10/2006 | Murthy et al. | |
| 2007/0009021 A1 * | 1/2007 | Olgaard | 375/224 |

FOREIGN PATENT DOCUMENTS
WO WO 2006/027583 * 3/2006

OTHER PUBLICATIONS

PCT International Search Report and Written Opinion Application No. PCT/US2008/082409—Dated Apr. 24, 2009—11 Pages.
Murray, B.M. et al.: "AGC and Quantization Effects in a Zero-Forcing MIMO Wireless System" Vehicular Technology Conference, 2006. VTC 2006—Spring. IEEE 63rd vol. 4, May 7-10, 2006, pp. 1802-1806.
H. Wu et al.: "Energy and Spectrum Efficient Transmission Modes for the 3GPP-Lite Uplink" in Proc. of PIMRC07, Athens, Greece, Sep. 2007, pp. 1-5.
International Preliminary Report on Patentability mailed on Jun. 10, 2010 in counterpart International Application No. PCT/US2008/082409.

* cited by examiner

*Primary Examiner* — Sam K Ahn
*Assistant Examiner* — Sophia Vlahos
(74) *Attorney, Agent, or Firm* — Barbara R. Doutre

(57) ABSTRACT

A method for use in a digital communications receiver for controlling an input signal level (200) into an analog-to-digital converter (ADC) initially receives a sample sequence (201) where a threshold crossing rate is measured as a percentage samples of an input signal that exceed the threshold (203). The error between the measured threshold crossing rate and a desired reference threshold crossing rate is calculated (205) and an error signal is then utilized in a feedback loop to control the receiver gain such that the error is reduced (207).

2 Claims, 3 Drawing Sheets

METHOD AND APPARATUS FOR COMPLEMENTARY CUMULATIVE DISTRIBUTION DRIVEN LEVEL CONVERGENCE FOR SPECTRUM SENSING

FIELD OF THE INVENTION

The present invention relates generally to digital communications systems and more particularly to the control of signal input levels in a digital communications receiver for the purpose of sensing the presence of a plurality of different waveforms.

BACKGROUND

In general, a typical digital communications receiver is designed for use in connection with a particular type of input waveform. When the waveform is received, an analog-to-digital converter (ADC) input signal is maintained at a power level in order to maximize ADC's dynamic range. This ultimately works to minimize quantization noise and clipping induced noise for enhanced receiver performance over a range of input signal levels. In other words, the power level into the ADC is constrained to maximize the signal-to-noise ratio (SNR) of the particular digitized waveform. In that the receiver is designed for one type of input waveform, these types of power level control methods minimize the error in ADC input power relative to some reference power level, which is selected based on apriori knowledge of the input waveform characteristics.

One example of this type arrangement is where the power of a matched filter output is compared to a reference power determined by the signal of interest, the ADC dynamic range, RF front end parameters, etc. The front end gain is adjusted to minimize the difference between the power of the matched filter output and the reference power. This type of matched filter design is based on the known signal waveform such as a pseudo-random noise (PN) sequence, packet preamble, pilot tone, or the like. Often, the reference power is selected according to the peak-to-average characteristic of the waveform to be detected. Accordingly, the reference power for an orthogonal frequency division multiplexing (OFDM) signal will differ from that of a single tone (sine wave) or a direct sequence spread spectrum (DSSS) waveform. Note that for most useful waveforms (excepting a single tone) a certain amount of clipping is typically permissible in order to maximize SNR, where the percentage of clipping is dependent on the input waveform.

Gain control stages as used in the prior art are not adequate for spectrum sensing in cognitive radio applications. In cognitive radio, the signal or waveform input to the ADC is, in general, random and unknown. Also, there may be several superimposed waveforms present on the scanned channel which are then input to the ADC. In this case, the a priori waveform characteristics required to determine an optimal reference power for level control are absent.

Hence, there is a need to provide a means to achieve a desired level of clipping which is acceptable for spectrum sensing in the absence of apriori knowledge of waveform characteristics.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
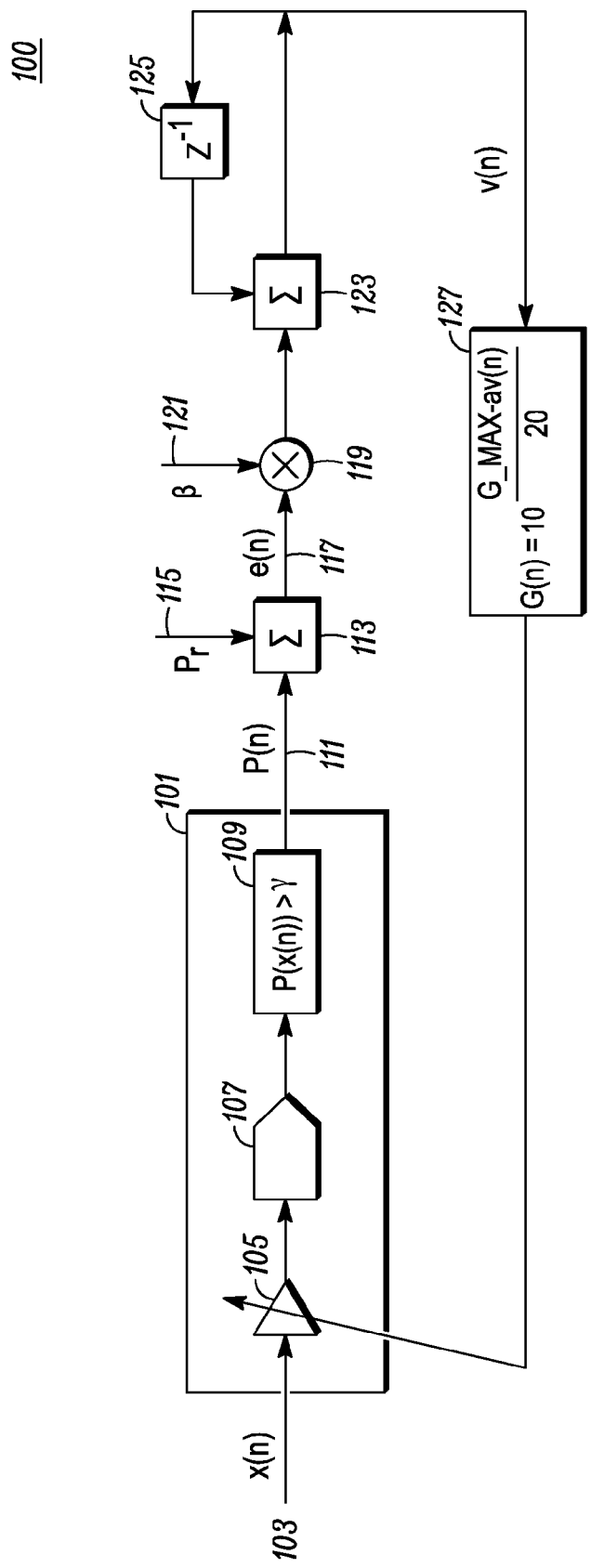
FIG. 1 a block diagram illustrating the complementary cumulative distribution driven level convergence system in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a complementary cumulative distribution driven level convergence system and method. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of a complementary cumulative distribution driven level convergence system as described herein. The non-processor circuits may include, but are not limited to, a radio receiver, a radio transmitter, signal drivers, clock circuits, power source circuits, and user input devices. As such, these functions may be interpreted as steps of a method to perform a complementary cumulative distribution driven level convergence. Alternatively, some or all functions could be implemented by a state machine that has no stored program instructions, or in one or more application specific integrated circuits (ASICs), in which each function or some combination of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Turning now to the drawings, FIG. 1 is a block diagram illustrating the complementary cumulative distribution driven level convergence (CCDDLC) control loop system in accordance with an embodiment of the invention. The system 100 includes an input signal x(n) 103. This is input to a variable gain amplifier 105 in receiver 101. The output of the variable gain amplifier 105 is directed to an ADC 107 whose digital sample sequence is sent to a function representing the complementary cumulative distribution function (CCDF), $P(x(n))>\gamma$ 109, where $\gamma$ is the absolute maximum output value supported by the ADC, known as the clipping level.

The output of the of the CCDF 109 is represented as the function P(n) 111. This is applied to a mathematical subtraction function 113 with a target CCDF represented by Pr 115. The output of the subtraction, P(n)−Pr, provides a signal e(r) 117 which is provided to a multiplication function 119 where it is multiplied with a value 121 representing the loop gain. The output of the multiplication function 119 is input to a loop filter 123 which sums the multiplication function 119 output and the previous value 125 of the gain control value 126. The output is the new gain control value, v(n) 126, which is in turn input to a function 127 which generates the variable gain amplifier's gain value G(n), according to the variable gain amplifier's gain response characteristic where G(n)=10 [G_max−av(n)/20] were G_max is the maximum gain in decibels (dB) and 'a' is a predetermined constant of proportionality (e.g. dB/bit) used in connection with the control value v(n). Thereafter, G(n) is then used to control the gain of the variable gain amplifier 105. Thus, this invention controls an ADC input signal power level to yield a desired probability of clipping without prior consideration of waveform characteristics. Those skilled in the art will recognize that this technique is appropriate for spectrum sensing applications where the use of a waveform dependent, predetermined reference power as a set point is not feasible.

Rather than using ADC input signal power as used in prior art topologies, the system 100 uses the complementary cumulative distribution function, $CCDF_X(\gamma)=P(X>\gamma)$, of the input waveform as the comparative statistic. The CCDF at the $n^{th}$ ADC sample is estimated as:

$$ccdf(n) = \frac{1}{N} \sum_{k=n-N+1}^{n} I_x(k)$$

where
$I_x(k)=0$ for $|x(k)|\leq\gamma$
1 for $|x(k)|>\gamma$
is the indicator function;
and $\gamma$ is the clipping level of the ADC.

As seen in FIG. 1, the CCDF statistic is the input to an exemplary (PI) control loop where $P_r$ represents the target CCDF, P(n) is the CCDF at sample n, $\beta$ is the loop gain and G(n) is the programmable gain amplifier gain for a control value, v(n).

For this non-linear system, an idealized linear approximation using perturbation (small signal) analysis can be used to characterize the performance (e.g., convergence time, stability) and obtain qualitative insight.

Let $P(n)=CCDF_X(\gamma)$ at time n,
$P_r$=targetCcdf
Assume the CCDF is a function of control value, v(n), and the signal power, $P_x(n)$:
$P(n)=f(v(n), P_x(n))$ where this idealized model assumes no delay in the programmable gain amplifier.

If the equilibrium values of v(n), $P_x(n)$ and P(n) is $v_{ST}, P_{xST}$, and $P_{ST}=P_r$, respectively; and the deviation from steady state is:

$$\hat{v}(n)=v(n)-v_{ST}(n)$$

$$\hat{P}_x(n)=P_x(n)-P_{xST}(n)$$

$$\hat{P}(n)=P(n)-P_r(n)$$

Then $$\hat{P}(n) = \frac{\partial f(v_{ST}, P_{xST})}{\partial v}\hat{v}(n) + \frac{\partial f(v_{ST}, P_{xST})}{\partial P_x}\hat{P}_x(n) \quad \text{(Eq. 1)}$$
$$= K_1\hat{v}(n) + K_2\hat{P}_x(n)$$

$$\hat{v}(n) = \beta\hat{P}(n) + \hat{v}(n-1) \quad \text{(Eq. 2)}$$
$$= \beta[K_1\hat{v}(n) + K_2\hat{P}_x(n)] + \hat{v}(n-1)$$

or, taking the Z transform, $$\hat{V}(z) = \frac{\beta K_2 \hat{P}_x(z)}{(1-\beta K_1)-z^{-1}}$$

Also from (Eq. 2)

$$\hat{P}(z) = \frac{1}{\beta}\hat{V}(z)(1-z^{-1}) \quad \text{(Eq. 3)}$$
$$= \frac{K_2\hat{P}_x(z)[1-z^{-1}]}{[1-K_1\beta]-z^{-1}}$$

It is shown below that $K_1 \leq 0$. Then, given the pole $$\frac{1}{[1-K_1\beta]},$$

the loop is stable for $\beta>0$.

Also for a step deviation from equilibrium on input signal power, the deviation from the CCDF equilibrium point is $$\hat{P}_{step}(z) = \frac{1}{1-z^{-1}} \frac{K_2[1-z^{-1}]}{[1-K_1\beta]-z^{-1}} \quad \text{(Eq. 4)}$$
$$= \frac{K_2}{[1-K_1\beta]} \frac{1}{1-\frac{1}{[1-K_1\beta]}z^{-1}}$$

so $$\hat{P}_{step}(n) = K_2\left(\frac{1}{[1-K_1\beta]}\right)^{n+1} \quad \text{(Eq. 5)}$$

which illustrates that the CCDF converges to 0 when $\beta>0$, $K_1 \leq 0$.

Also, $$\lim_{z \to 1}(z-1)\hat{P}_{step}(z) = \lim_{z \to 1}(z-1)\frac{K_2}{[1-K_1\beta]-z^{-1}} = 0 \quad \text{(Eq. 6)}$$

confirming convergence for a step input change in input signal power.

Finally, the number of samples required for $\hat{p}_{step}(n)$ to go from 0.95 to 0.05, relative to maximum deviation due to a step change in input signal power (i.e., the response time) is:

$$\Delta n = \frac{3}{\ln[1-K_1\beta]} \text{ samples} \quad \text{(Eq. 7)}$$

In general, the exact pole location and hence the response time are difficult to determine analytically due to the dependence on $$K_1 = \frac{\partial f(v_{ST}, P_{xST})}{\partial v}.$$

The slope of the CCDF vs. control value, v, curves can be examined empirically.

Insight, can be obtained by examining the case of a sinusoidal input signal $$x(n) = A\cos(2\pi f_o n T_s)$$

where $f_o < F_s/2$ is the waveform frequency, $T_s = 1/F_s$ is the sample time duration.

A clipping event occurs when the output of the variable gain amp exceeds the ADC maximum input level, i.e., $$Gx(n) = GA\cos(2\pi f_o n T_s) > \gamma$$

where $$G(dB) = G\_MAX - sv$$

or $$G = 10^{\frac{G\_MAX - sv}{20}}.$$

The CCDF is given by $$CCDF(v,A) = 2\frac{f_o}{F_s}\max\left[0, 2\text{ ceil}\left\{\frac{F_s}{2\pi f_o}\cos^{-1}\left(\frac{\gamma}{GA}\right)\right\} - 1\right] \quad \text{(Eq. 8)}$$

$$= 2\frac{f_o}{F_s}\max\left[0, 2\text{ ceil}\left\{\frac{\frac{F_s}{2\pi f_o}\cos^{-1}\left(\frac{\gamma}{A}\right)}{10^{\frac{-G\_MAX}{20}}10^{\frac{sv}{20}}}\right\} - 1\right]$$

Note, the max function is required to cover the case of $$\frac{\gamma}{GA} = 1.$$

For G such that $$\frac{\gamma}{GA} \geq 1,$$

no clipping occurs and the CCDF=0

Determination of $K_1$, requires taking the partial derivative of CCDF(v,A) with respect to v. However, CCDF(v,A) is a non-linear function of v, with dis-continuities due to the ceil ( ) function. However, a linear approximation to CCDF(v,A) can provide a qualitative and fairly accurate quantitative result for $K_1$. The partial derivative of $$CCDF_{lin}(v,A) = \frac{2}{\pi}\cos^{-1}\left(\frac{\gamma}{A}10^{\frac{-G\_MAX}{20}}10^{\frac{sv}{20}}\right) - 1 \quad \text{(Eq. 9)}$$

yields the equation:

$$K_1 = \frac{\partial CCDF_{lin}(v,A)}{\partial v} \quad \text{(Eq. 10)}$$

$$= \frac{-s\ln(10)}{10\pi}\frac{1}{\left(\frac{A^2}{\gamma^2}10^{\frac{G\_MAX-sv}{10}} - 1\right)^{1/2}}$$

The response time (at a given control value v) is given as $$\Delta n = \frac{3}{\ln[1-K_1\beta]}$$

Figure 2:
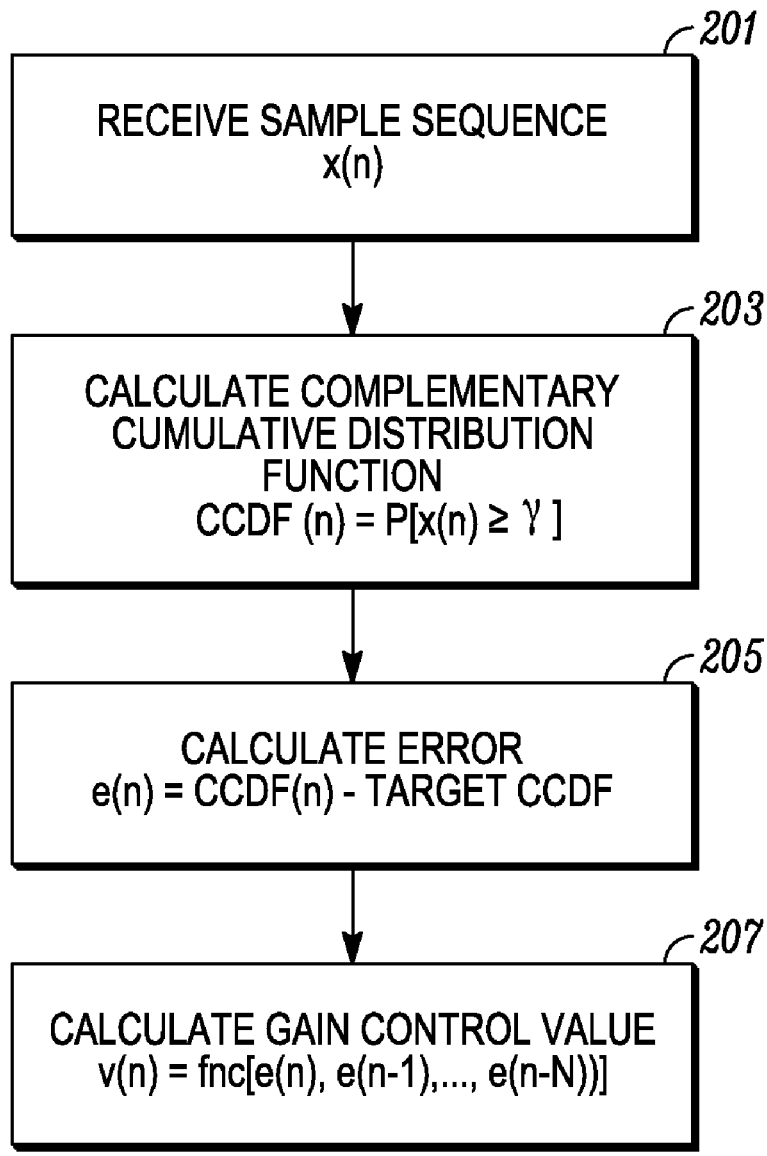
FIG. 2 is a flowchart diagram illustrating high level steps in the complementary cumulative distribution driven level convergence method in accordance with an embodiment of the invention.

FIG. 2 is a flow chart diagram illustrating high level steps in the complementary cumulative distribution driven level convergence method in accordance with an embodiment of the invention. The convergence method 200 includes receiving a sample sequence x(n) 201, where the complementary cumulative distribution function CCDF(n)=P[x(n)≧γ] is calculated 203. The error e(n)=CCDF(n)−target CCDF is calculated 205 and the finally a gain control value v(n)=fnc[e(n), e(n−1), . . . e(n−N))] is determined 207 for applications with a particular amplifier stage and/or device. Thus, the function can be a scaling function, a linear combination function of e(n), e(n−1), . . . such as a filter; a non-linear function, or any combination thereof.

Figure 3:
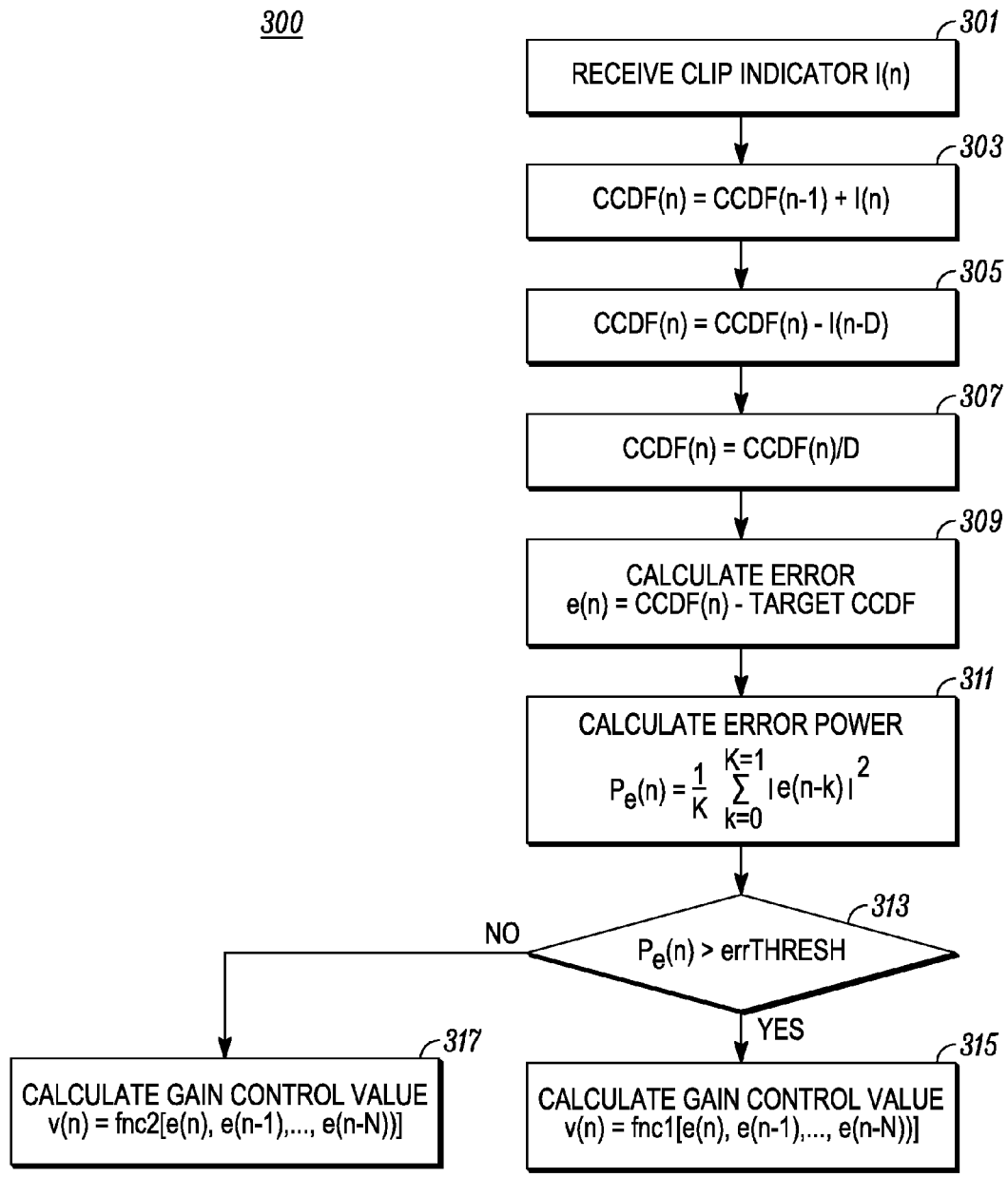
FIG. 3 is a flowchart diagram illustrating a detailed description of the complementary cumulative distribution driven level convergence method in accordance with an embodiment of the invention.

FIG. 3 is a flowchart diagram illustrating a detailed description of the complementary cumulative distribution driven level convergence method in accordance with an embodiment of the invention. As seen in FIG. 3, the convergence method 300 includes the steps of receiving a clip indicator I(n) 301. Those skilled in the art will recognize that the clip indicator is a "clip" or sample of the input waveform into a device such as an ADC. Once a signal is received indicating that the analog-to-digital converter (ADC) input has clipped, then a binary signal from the ADC is generated by a comparison between the ADC sample output, x(n), and the clip level. The CCDF can be calculated by adding the most recent clip indicator value, I(n), to the CCDF accumulator 303 and subtracting the oldest clip indicator, I(n−D) 305, where the CCDF is calculated over D clip indicator samples. That is $$CCDF(n) = \frac{1}{D}\sum_{k=0}^{D-1} I(n-k) = \frac{1}{D}[CCDF(n-1) + I(n) - I(n-D)]$$

Thereafter, the difference between CCDF(n) and target CCDF e(n) is calculated 309 as well as a calculation for the error power ($P_e$) 311 where $$P_e(n) = \frac{1}{K}\sum_{k=0}^{K} |e(n-k)|^2$$

Finally, the gain control, v(n), is calculated using a first function (fnc1) 315 where v(n)=fnc1[e(n), e(n−1), . . . , e(n−N))], if the error power is greater than a threshold 313, otherwise a second function (fnc2) 317 where v(n)=fnc2[e(n), e(n−1), . . . e(n−N))], is used. An example first and second function is a first and second error multiplier 119 selected according to the error power. The first and second functions are associated with locked and unlocked states, respectively. When the error power exceeds a threshold, the first function associated with the unlocked state is used to cause quicker convergence to the correct gain control value 315. Once the error is below a threshold, the second function associated with the locked state is used to reduce the variation of the gain control about the correct value 316.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A digital communications receiver comprising:
   at least one controllable amplifier stage operating based on a calculated error power; and
   at least one analog-to-digital converter (ADC) for receiving a signal from the at least one controllable amplifier stage; and
   at least one gain controller; and
   wherein the at least one gain controller is configured to:
   receive at least one input sample;
   calculate a complementary cumulative distribution function (CCDF) for the input sample within a predetermined clipping level of the ADC;
   calculate an error value, the error value being the difference between the calculated CCDF and a target CCDF; and
   apply the error value to a multiplication function where it is multiplied with a value representing loop gain to generate a multiplication function output, the multiplication function output being input to a loop filter, the loop filter summing the multiplication function output and a previous value of a gain control value of the at least one gain controller thereby generating a control value as a function of the error value for adjusting the gain of the at least one controllable amplifier stage which in turn controls the ADC input signal power level to yield a desired probability of clipping without prior consideration of waveform characteristics.

2. A digital communications receiver as in claim 1, wherein generating the control value comprises generating the control value as the function of the error value for adjusting the gain of the at least one controllable amplifier stage such that the error value is reduced and a desired rate of clipping at the input sample is achieved regardless of power of the input sample and waveform of the input sample.

* * * * *